US011864325B2

(12) United States Patent
Koshiji et al.

(10) Patent No.: US 11,864,325 B2
(45) Date of Patent: Jan. 2, 2024

(54) METHOD FOR FORMING METAL PATTERN

(71) Applicant: TANAKA KIKINZOKU KOGYO K.K., Tokyo (JP)

(72) Inventors: Kenjiro Koshiji, Tsukuba (JP); Yuichi Makita, Tsukuba (JP); Noriaki Nakamura, Tsukuba (JP); Masato Kasuga, Tsukuba (JP); Yuusuke Ohshima, Tsukuba (JP); Hiroki Sato, Tsukuba (JP); Shigeyuki Ootake, Tsukuba (JP); Hitoshi Kubo, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 93 days.

(21) Appl. No.: 17/613,569

(22) PCT Filed: Jun. 18, 2020

(86) PCT No.: PCT/JP2020/024012
§ 371 (c)(1),
(2) Date: Nov. 23, 2021

(87) PCT Pub. No.: WO2020/256072
PCT Pub. Date: Dec. 24, 2020

(65) Prior Publication Data
US 2022/0248538 A1     Aug. 4, 2022

(30) Foreign Application Priority Data

Jun. 20, 2019  (JP) ................................ 2019-114430

(51) Int. Cl.
*H05K 3/12* (2006.01)
*B05D 3/10* (2006.01)
(Continued)

(52) U.S. Cl.
CPC ................. *H05K 3/12* (2013.01); *B05D 3/10* (2013.01); *B05D 5/067* (2013.01); *B05D 7/24* (2013.01);
(Continued)

(58) Field of Classification Search
CPC . B05D 3/10; B05D 5/067; B05D 7/24; B05D 7/54; H05K 3/12; C09D 11/03
See application file for complete search history.

(56) References Cited

U.S. PATENT DOCUMENTS

2017/0256332 A1*  9/2017  Miyazaki ................. B05D 5/12
2018/0193913 A1*  7/2018  Iwai ................. H01C 17/06526
2019/0159345 A1*  5/2019  Ito ........................... H05K 3/381

FOREIGN PATENT DOCUMENTS

JP    2012-221587 A    11/2012
JP    2016-048601 A     4/2016
(Continued)

OTHER PUBLICATIONS

International Searching Authority, "International Search Report," issued in connection with International Patent Application No. PCT/JP2020/024012, dated Sep. 15, 2020.
(Continued)

*Primary Examiner* — Nathan T Leong
(74) *Attorney, Agent, or Firm* — Foley & Lardner LLP

(57) ABSTRACT

The present invention relates to a method for forming a metal pattern on a pattern formation section set on a base material. In the present invention, a substrate provided with a fluorine-containing resin layer on a surface of the base material including the pattern formation section is used. The present inventive method for forming a metal pattern includes steps of: forming a functional group on the pattern formation section; and applying a metal ink including an amine compound and a fatty acid as protective agents to the
(Continued)

(×200)

(×2000)

base material surface to fix the metal particles on the pattern formation section. In the present invention, a fluorine-containing resin having a surface free energy measured by the Owens-Wendt method of 13 mN/m or more and 20 mN/m or less is applied as the fluorine-containing resin layer. Further, a metal ink including ethyl cellulose as an additive is applied as the metal ink.

16 Claims, 1 Drawing Sheet

(51) Int. Cl.
*B05D 5/06* (2006.01)
*B05D 7/24* (2006.01)
*B05D 7/00* (2006.01)
*C09D 11/03* (2014.01)
*C09D 11/52* (2014.01)

(52) U.S. Cl.
CPC ............... *B05D 7/54* (2013.01); *C09D 11/03* (2013.01); *C09D 11/52* (2013.01)

(56) References Cited

FOREIGN PATENT DOCUMENTS

| JP | 2017-034236 A | 2/2017 |
| WO | WO-2017/033911 A1 | 3/2017 |
| WO | WO-2019/031324 A1 | 2/2019 |

OTHER PUBLICATIONS

International Searching Authority, "Written Opinion," issued in connection with International Patent Application No. PCT/JP2020/024012, dated Sep. 15, 2020.

\* cited by examiner (×200)  (×2000)

Fig. 2(a) AROUND SILVER WIRING    Fig. 2(b) NON-EXPOSED REGION (×2000)  (×2000)

ly fine metal pattern with reliable quality, the present inventors have found that when a predetermined fluorine-containing resin is applied as the above fluorine-containing resin, the same effect as with the above preferred fluorine-containing resin can be exerted. The predetermined fluorine-containing resin is characterized by its glass transition temperature (Tg) and initial contact angle with water, even though the resin is a fluorine-containing resin that has been conventionally applied.

METHOD FOR FORMING METAL PATTERN

RELATED APPLICATIONS

The present application claims priority under 37 U.S.C. § 371 to International Patent Application No. PCT/JP2020/024012, filed Jun. 18, 2020, which claims priority to and the benefit of Japanese Patent Application No. 2019-114430, filed on Jun. 20, 2019. The contents of these applications are hereby incorporated by reference in their entireties.

BACKGROUND OF THE INVENTION

Field of the Invention

The present invention relates to a method for forming a metal pattern on a surface of any base material. Specifically, the present invention relates to a method for forming a metal pattern on a base material including a predetermined fluorine-containing resin layer, the method being capable of forming a fine metal pattern with a metal ink having a predetermined configuration.

Description of the Related Art

With an increase in density of semiconductor devices and an increase in size of screens of displays and touch panels, wiring and electrode circuits to be used in these devices have required a process capable of forming a pattern that is made finer than ever and has a large area. To meet this demand, the present applicant has already suggested applying metal thin lines in a micron order including silver, copper, and the like as wiring and electrode materials (Patent Document 1). The reason why the metal thin lines of silver and the like are applied as wiring and electrode materials is because these metals have high electric conductivity and can suppress the total resistance value to a low value even by increasing the area of wiring patterns. Further, these metals are not transparent, but have an advantage in that light transmissivity required for touch panels and the like can be provided when these metals are formed into thin lines in a micron order beyond a visible region for humans.

Then, the above Patent Document 1 of the present applicant discloses a unique process for finely patterning the metal thin lines in a micron order. In this metal pattern formation process, a liquid-repellent fluorine-containing resin is applied to a base material, and then a pattern formation section on which a metal pattern is formed is irradiated with ultraviolet rays and the like. This produces a functional group (hydrophilic group) such as a carboxy group on the pattern formation section of the surface of a fluorine-containing resin layer. To the thus pretreated base material, a metal ink is applied. The metal ink (hereinafter may be simply referred to as the ink) refers to a liquid in which metal particles protected by an appropriate protective agent are dispersed in a solvent. When the metal ink is applied to the above pretreated base material, the metal particles in the ink are bound to the functional group and fixed. In a region where no functional group is present, the ink is repelled due to the liquid-repellency of the fluorine-containing resin layer, so that the metal particles cannot bind to the fluorine-containing resin layer. Then, the metal particles are sintered as needed to form a metal pattern. Heat treatment is not essential for sintering the metal particles. The metal particles fixed on the pattern formation section of the base material may be adjacent to one another and self-sintered. The metal wiring after sintering (after self-sintering) is constituted of metals close to the bulk state and exerts electrical characteristics preferred as a wiring and electrode material.

In the above pattern formation process by the present applicant, light irradiation such as ultraviolet ray irradiation is applied when a functional group is formed on the surface of the fluorine-containing resin layer on the base material. This enables to efficiently produce a highly fine metal pattern on the base material. In the metal ink used in this process by the present applicant, two types of protective agents, an amine compound and a fatty acid are applied, so that the sintering of the metal particles occurs at relatively low temperature. Thus, this pattern formation process has a wide selection range of constituent materials for the base material, and transparent and lightweight resin materials can be applied. Then, an extremely thin metal wiring having a width of several μm or less can also be formed at a high density, and an electrically conductive substrate having a light transmissivity equivalent to that of the electrically conductive substrate in which a transparent electrode is applied can be produced.

PRIOR ART DOCUMENT

Patent Document

Patent Document 1
Japanese Patent Application Laid-Open No. 2016-48601

SUMMARY OF THE INVENTION

Technical Problem

In the above pattern formation process, treatment of imparting liquid-repellency to the surface of the base material by forming the fluorine-containing resin layer is essential. Examinations made by the present inventors have demonstrated that a difference occurs in the formation or non-formation of the metal pattern (printability) depending on the type of the fluorine-containing resin. In this regard, Patent Document 1 mentions specific fluorine-containing resins such as perfluorobutenyl vinyl ether polymer (CY-TOP (registered trademark): AGC Inc.) as preferred fluorine-containing resins. When such fluorine-containing resins are applied, a highly fine metal pattern can be reliably formed.

However, since some of the preferred fluorine-containing resins mentioned above are relatively expensive, an increase in the cost of forming the wiring and electrode is concerned. The fluorine-containing resin layer is formed on the entire surface of a region for forming a metal pattern on the base material. Thus, high-cost fluorine-containing resins may be a factor that hinders to address the increase in size of screens of displays and touch panels.

The present invention is achieved under the above circumstances, and an object of the present invention is to provide a method that allows forming of a higher-quality metal pattern and allows widening of the scope of application of fluorine-containing resins, for the metal pattern formation process by the present applicant as mentioned above.

Solution to Problem

In the metal pattern formation process mentioned above (Patent Document 1), liquid-repellency is imparted to a base material by a fluorine-containing resin layer, and then light irradiation and the like are performed to eliminate the liquid-repellency of the pattern formation portion and impart the bondability of metal particles to the portion. To appropriately perform this pattern formation through the bonding of metal particles, the liquid-repellency in the region other than the pattern formation portion is important. That is, the fluorine-containing resin layer in this region should exert sufficient liquid-repellency to repel the metal ink. The present inventors have inferred that one of the factors for the occurrence of good or bad printability depending on the type of fluorine-containing resin is the difference in the liquid-repellency between fluorine-containing resins. Then, the present inventors have considered that it is important to increase the liquid-repellency of the fluorine-containing resin layer to ensure the preferred printability in the conventional process.

Further, the present inventors have also considered that the improvement of the conventional process requires to consider not only the liquid-repellency of the fluorine-containing resin itself, but also the characteristics of the metal ink to be applied. Specifically, the present inventors have inferred that the liquid-repellency of the fluorine-containing resin layer in the conventional process is influenced by not only the liquid-repellency of the resin itself, but also the wettability of the metal ink to be applied.

For this inference, as a specific example, description will be made with reference to the perfluorobutenyl vinyl ether polymer (CYTOP (registered trademark)) which is the particularly preferred fluorine-containing resin in the conventional process. In the conventional process, CYTOP (registered trademark) is considered as a fluorine-containing resin having high liquid-repellency. It is deemed that this evaluation is correct. However, this liquid-repellency is an evaluation based on the relationship with the metal ink applied in the conventional process.

When the liquid-repellency of fluorine-containing resins are compared based on common solvents such as water, CYTOP (registered trademark) does not exhibit the highest liquid-repellency and there are fluorine-containing resins that are estimated to have higher liquid-repellency. When such fluorine-containing resins having higher liquid-repellency are applied to the conventional pattern formation process, preferred patterning cannot be performed in some cases. This is deemed that the printability in the conventional process is influenced by the relative relationship between the liquid-repellency of the fluorine-containing resin and the characteristics of the metal ink.

Here, studies on the conventional metal ink by the present inventors reveal that the conventional metal ink is a liquid that has relatively high wettability and easily wet-spreads on and attaches to an application surface. The present inventors have examined whether or not the scope of application of the fluorine-containing resin can be extended by adjusting the configuration of such a metal ink having high wettability.

Through the study process as described above, the present inventors have found that the above problems can be solved by adjusting the configuration of the metal ink while setting the liquid-repellency of the fluorine-containing resin layer to fall within a preferred range by a common specific method. As a result of intensive studies, the present inventors have arrived at the present invention.

That is, the present invention is drawn to a method for forming a metal pattern on a pattern formation section set in a part or the whole of a region on a base material, the base material comprising a fluorine-containing resin layer on a surface including at least the pattern formation section, the method comprising: a step of forming a functional group on the pattern formation section on the surface of the fluorine-containing resin layer; and a step of applying a metal ink in which metal particles protected by an amine compound serving as a first protective agent and a fatty acid serving as a second protective agent are dispersed in a solvent to the surface of the base material to fix the metal particles on the pattern formation section, wherein the fluorine-containing resin layer includes a fluorine-containing resin having a surface free energy measured by the Owens-Wendt method of 13 mN/m or more and 20 mN/m or less, and the metal ink includes ethyl cellulose as an additive.

The metal pattern formation process of the present invention has two features: (a) applying a layer including a fluorine-containing resin having liquid-repellency in a predetermined range that is set based on a common and objective index, and (b) applying a metal ink which contains ethyl cellulose and in which wettability is adjusted (less wettable) to the fluorine-containing resin layer, while maintaining the configuration and advantages of conventional technique (Patent Document 1).

Hereinafter, the features of the present invention will be described in detail. The metal pattern formation process of the present invention comprises (I) preparation step of a base material provided with a fluorine-containing resin, (II) formation step of a functional group on the surface of the fluorine-containing resin layer, (III) application step of a metal ink and fixation step of metal particles, as essential steps. In the following description, the details of each step will be described on the basis of the above features.

(I) Preparation Step of Base Material Provided with Fluorine-Containing Resin

In the present invention, first, it is necessary to prepare a base material having a fluorine-containing resin layer on its surface. In this step, the base material may be prepared by, for example, purchasing a base material on which a fluorine-containing resin layer is formed in advance, or may be prepared by applying a fluorine-containing resin to a base material.

(i) Base Material

The constituent material for the base material is not particularly limited. A base material made of metal or a base material made of glass or ceramic can be applied. A base material made of resin or plastic can also be applied. The base material may be a transparent body or translucent body capable of transmitting light, or may be an opaque body incapable of transmitting light. There is no limitation on the thickness of the base material at all. The region where a metal pattern is formed on the base material may be set in the whole or a part of the surface of the base material, or may be set in a plurality of portions on the base material.

(ii) Fluorine-Containing Resin Layer

The fluorine-containing resin layer is basically the same as the fluorine-containing resin applied in the conventional process (Patent Document 1). That is, as the fluorine-containing resin, a fluorine-containing resin being a polymer having one or two or more repeating units based on a fluorine-containing monomer containing fluorine atoms can be applied. The fluorine-containing resin may be a polymer having one or two or more repeating units based on a fluorine-containing monomer and one or two or more repeating units based on a non-fluorine-containing monomer that does not contain fluorine atoms. The fluorine-containing resin in the present invention may further contain heteroatoms such as oxygen, nitrogen, and chlorine atoms in a part of the fluorine-containing resin.

From the viewpoint of liquid-repellency to be at least provided, a fluorine-containing resin including a polymer having at least one repeating unit in which the ratio of the number of fluorine atoms to the number of carbon atoms (F/C) is 1.0 or more is preferable, regarding repeating units based on a fluorine-containing monomer that constitutes a polymer, similarly to the conventional process. The ratio F/C in the repeating unit based on the fluorine-containing monomer is more preferably 1.5 or more. The upper limit of the ratio F/C is preferably 2.0 from the viewpoint of liquid-repellency and easy availability. The fluorine-containing resin that is particularly preferable regarding this requirement is a perfluoro resin having repeating units based on a perfluoro compound monomer, and in the perfluoro resin, the ratio F/C in the repeating unit is 1.5 or more.

In addition to the above basic constitutional requirements, the fluorine-containing resin of the present invention is specified such that the surface free energy measured by the Owens-Wendt method falls within a predetermined range. The Owens-Wendt method is a method in which a contact angle ($\theta$) when a liquid (L) as a specimen is dropped on the surface of a solid (S) as a measurement object is measured, and then the surface free energy ($\gamma_S$) of the solid (S) is determined based on the contact angle ($\theta$). The surface free energy ($\gamma_S$) is calculated based on the following expression.

$$\gamma_L(1+\cos\theta)=2(\gamma_S^d\gamma_L^d)^{1/2}+2(\gamma_S^h\gamma_L^h)^{1/2} \quad [\text{Expression 1}]$$

$\gamma_L$: Surface free energy of liquid (specimen)
$\gamma_L^d$: Liquid-side dispersion force component
$\gamma_S^d$: Solid-side dispersion force component
$\gamma_L^h$: Liquid-side non-dispersion force component
$\gamma_S^h$: Solid-side non-dispersion force component $$\gamma_S=\gamma_S^d+\gamma_S^h \quad [\text{Expression 2}]$$

$\gamma_S$: Surface free energy of solid (sample)

In the calculation of $\gamma_S^d$ and $\gamma_S^h$ for determining the surface free energy ($\gamma_S$), contact angles of two kinds of liquids whose $\gamma_L$, $\gamma_L^d$, and $\gamma_L^h$ are known are measured, and then $\gamma_S^d$ and $\gamma_S^h$ are calculated based on the above Expression 1. The two kinds of liquids preferred as specimens in the present invention are a combination of a solvent having a high polar component and a solvent having a low polar component. Specific examples thereof include water ($\gamma_{L(w)}$, $\gamma_{L(w)}^d$=21.8 mN/m, $\gamma_{L(w)}^h$=51 mN/m) and n-octane ($\gamma_{L(o)}$, $\gamma_{L(o)}^d$=21.6 mN/m, $\gamma_{L(o)}^h$=0 mN/m). These two solvents are a combination of a polar solvent having a high polar component $\gamma^d$ and a non-polar solvent having a low polar component $\gamma^d$ and are preferable as the specimens to be applied in the present invention. Then, the following simultaneous equations are solved to calculate $\gamma_S^d$ and $\gamma_S^h$, and from the total of $\gamma_L^d$ and $\gamma_L^h$, the surface free energy ($\gamma_S$) of the resin (S) that constitutes the fluorine-containing resin layer can be obtained.

$$\gamma_{L(w)}(1+\cos\theta(w))=2(\gamma_S^d\gamma_{L(w)}^d)^{1/2}+2(\gamma_S^h\gamma_{L(w)}^h)^{1/2}$$

$$\gamma_{L(o)}(1+\cos\theta(o))=2(\gamma_S^d\gamma_{L(o)}^d)^{1/2}+2(\gamma_S^h\gamma_{L(o)}^h)^{1/2} \quad [\text{Expression 3}]$$

In the present invention, the fluorine-containing resin layer is determined such that the surface free energy ($\gamma_S$) of the fluorine-containing resin is 13 mN/m or more and 20 mN/m or less. A fluorine-containing resin having a surface free energy of more than 20 mN/m is poor in liquid-repellency and the fluorine-containing resin layer cannot be patterned even with the metal ink that is improved in the present invention.

In the fluorine-containing resin layer in the present invention, unlimitedly high liquid-repellency (low surface free energy) is not always good, and the limit of the liquid-repellency should be set. If the liquid-repellency is too high, the metal ink (metal particles) is not adsorbed on a portion where a functional group is formed and pattern formation may be failed. Also, if a pattern can be formed, too high liquid-repellency may cause insufficient adhesive strength of metal particles. From these viewpoints, the lower limit value of the surface free energy of the fluorine-containing resin layer is 13 mN/m.

Specific examples of the fluorine-containing resin applicable in the present invention include Fluoro Surf (registered trademark, FluoroTechnology Co., LTD.), Novec (registered trademark, 3M Japan Limited), and SFCOAT (AGC SEIMI CHEMICAL CO., LTD.). Also, perfluorobutenyl vinyl ether polymer (CYTOP (registered trademark): AGC Inc.), tetrafluoroethylene-perfluorodioxol copolymer (TFE-PDD), Teflon (registered trademark) AF: Chemours-Mitsui Fluoroproducts Co., Ltd.), and the like which are described as preferred in the conventional process (Patent Document 1) are applicable.

The thickness of the fluorine-containing resin layer including the fluorine-containing resin described above is not particularly limited. Generally, when the fluorine-containing resin layer is applied with a thickness of 0.01 µm or more, liquid-repellency can be exerted. The upper limit of the thickness is not particularly set, but when transparency is required, the upper limit of the thickness is about 5 µm. As long as the fluorine-containing resin layer encompasses a pattern formation section, the fluorine-containing resin layer may be formed on the whole surface of the base material or a part of a surface of the base material.

A solution obtained by dissolving a fluorine-containing resin in an appropriate solvent can be applied for forming a fluorine-containing resin layer on the base material. After the application, firing is performed to form a fluorine-containing resin layer. Examples of the method for applying a fluorine-containing resin include, but are not limited to, dipping, spin coating, and roll coating. After the fluorine-containing resin is applied, a post-treatment (drying treatment or firing treatment) appropriate to the resin is performed to form a fluorine-containing resin layer.

(II) Formation Step of Functional Group on Surface of Fluorine-Containing Resin Layer After preparation of a base material provided with a fluorine-containing resin layer, a functional group is formed on the surface of the fluorine-containing resin layer of the base material. The functional group is formed by cutting C—F bonds in the fluorine-containing resin. Specifically, a carboxy group, a hydroxy group or a carbonyl group is formed.

Examples of the method for treatment for forming a functional group on the surface of the fluorine-containing resin layer include ultraviolet-ray irradiation, corona discharge treatment, plasma discharge treatment and excimer laser irradiation. In these treatments, C—F bonds are cut by causing a photochemical reaction to occur on the surface of the fluorine-containing resin, and application of moderate energy is required. The approximate amount of applied energy to a pattern formation section is preferably 1 mJ/cm$^2$ or more and 4,000 mJ/cm$^2$ or less. For example, when the treatment is performed by ultraviolet-ray irradiation, irradiation with an ultraviolet ray having a wavelength in the range of 10 nm or more and 380 nm or less is preferable, and irradiation with an ultraviolet ray having a wavelength in the range of 100 nm or more and 200 nm or less is particularly preferable.

When the surface of the fluorine-containing resin layer is irradiated with an ultraviolet ray, generally an exposure treatment using a photomask (reticle) is performed. Regarding an exposure method in the present invention, either a non-contact exposure method (proximity exposure or projection exposure) or a contact exposure method (contact exposure) can be used. In proximity exposure, the distance between a mask and a surface of the fluorine-containing resin layer is preferably 10 μm or less, more preferably 3 μm or less.

(III) Application Step of Metal Ink and Fixation Step of Metal Particles

After functional group formation treatment is performed on the pattern formation section, the base material is brought into contact with a metal ink. In the present invention, the configuration of the metal ink is optimized for favorably forming a metal pattern.

(i) Configuration of Metal Ink (i-1) Metal Particles

The metal ink is obtained by dispersing metal particles to which a predetermined protective agent is bonded, in a solvent. The metal particles correspond to a constituent material for a metal pattern to be formed. Preferably, the metal particles include at least one of silver, gold, platinum, palladium, copper, and alloys of these metals. These metals are excellent in electric conductivity and useful as, for example, an electrode material.

The mean particle size of the metal particles of the metal ink is preferably 5 nm or more and 200 nm or less and is not particularly limited, as long as it falls within this range. However, in the metal ink containing ethyl cellulose to be applied in the present invention, an ink in which metal particles having a larger particle size are dispersed is liable to be easily repelled by a fluorine-containing resin. Thus, it is sometimes preferable to disperse metal particles having a large particle size, specifically, metal particles having a mean particle size of 40 nm or more and 150 nm or less, depending on the fluorine-containing resin of the substrate. However, since the improvement of the liquid-repellency of the metal ink by the present invention is mainly due to the optimization of the surface free energy ($\gamma_S$) of the fluorine-containing resin and the addition of ethyl cellulose to the ink, the necessity for limiting the mean particle size of the metal particles to a large particle size is low.

(i-2) Protective Agent

The protective agent in a metal ink refers to an additive that suppresses aggregation and coarsening of metal particles and stabilizes the dispersion state of metal particles. The aggregation and coarsening of metal particles not only causes precipitation of metal in storage and use of a dispersion liquid, but also influences sintering characteristics after bonding of the metal particles to the base material, and therefore must be avoided. In the present invention, the protective agent substitutes for the functional group on the surface of the base material (fluorine-containing resin layer) to act as a marker for fixing the metal. The protective agent for metal particles in the present invention includes an amine as a first protective agent, and a fatty acid as a second protective agent. In the present invention, these two types of compounds having different basic structures are combined and protect metal particles.

The amine compound serving as the first protective agent preferably has a total number of carbon atoms of 4 or more and 12 or less. This is because the carbon number of amine influences the stability of metal particles, and sintering characteristics in the formation of a pattern. When an amine having less than 4 carbon atoms is used, it is difficult for metal particles to stably exist, so that the formation of a uniform sintered body is difficult. On the other hand, when an amine having more than 12 carbon atoms is used, the stability of metal particles is excessively enhanced, so that heating at a high temperature is required for the formation of a pattern. Accordingly, an amine compound having a total number of carbon atoms of 4 or more and 12 or less is preferable as the protective agent in the present invention.

With regard to the number of amino groups in the amine compound, a (mono)amine having one amino group or a diamine having two amino groups can be applied. The number of hydrocarbon groups bonded to the amino group is preferably 1 or 2, that is, a primary amine ($RNH_2$) or a secondary amine ($R_2NH$) is preferable. When a diamine is applied as the protective agent, it is preferable that at least one amino group is a primary amine or a secondary amine. The hydrocarbon group bonded to the amino group may be a chain hydrocarbon having a linear structure or a branched structure, or a hydrocarbon group having a cyclic structure. The hydrocarbon group may contain oxygen in part.

Specific examples of the amine compound applied in the present invention as a protective agent include butylamine (4 carbon atoms), 1,4-diaminobutane (4 carbon atoms), 3-methoxypropylamine (4 carbon atoms), pentylamine (5 carbon atoms), 2,2-dimethylpropylamine (5 carbon atoms), 3-ethoxypropylamine (5 carbon atoms), N,N-dimethyl-1,3-diaminopropane (5 carbon atoms), hexylamine (6 carbon atoms), heptylamine (7 carbon atoms), benzylamine (7 carbon atoms), N,N-diethyl-1,3-diaminopropane (7 carbon atoms), octylamine (8 carbon atoms), 2-ethylhexylamine (8 carbon atoms), nonylamine (9 carbon atoms), decylamine (10 carbon atoms), diaminodecane (10 carbon atoms), undecylamine (11 carbon atoms), dodecylamine (12 carbon atoms), and diaminododecane (12 carbon atoms). To adjust the dispersibility and low-temperature sintering characteristics of metal particles in the dispersion liquid, the amine compound serving as the first protective agent may be used by mixing and combining a plurality of amine compounds. As long as the first protective agent includes at least one amine compound having a total number of carbon atoms of 4 or more and 12 or less, an amine compound having carbon atoms falling out of the range may exist.

The fatty acid to be applied as the second protective agent enhances the stability of metal particles by acting as an auxiliary protective agent for the amine compound in the dispersion liquid. The effect of the fatty acid is evidently exhibited after metal particles are applied to the base material, and a metal pattern having a uniform thickness can be formed by adding a fatty acid. This effect can be clearly understood by comparing to a case where fatty acid-free metal particles are applied, and a stable metal pattern cannot be formed with fatty acid-free metal particles.

The fatty acid is preferably an unsaturated or saturated fatty acid having 4 or more and 26 or less carbon atoms. A fatty acid having 3 or less carbon atoms deteriorates the dispersibility of metal particles in a dispersion medium, so that the metal particles are easily aggregated and formation of a stable metal pattern becomes difficult. On the other hand, a fatty acid having more than 26 carbon atoms is hardly desorbed from metal particles in the formation of a metal pattern and remains, so that the resistance value of the metal pattern is liable to be higher.

Specific examples of preferred fatty acid include saturated fatty acids such as butanoic acid (4 carbon atoms), pentanoic acid (5 carbon atoms), hexanoic acid (6 carbon atoms), heptanoic acid (7 carbon atoms), octanoic acid (8 carbon atoms), nonanoic acid (9 carbon atoms), decanoic acid (another name: capric acid, 10 carbon atoms), undecanoic acid (another name: undecylic acid, 11 carbon atoms), dodecanoic acid (another name: lauric acid, 12 carbon atoms), tridecanoic acid (another name: tridecylic acid, 13 carbon atoms), tetradecanoic acid (another name: myristic acid, 14 carbon atoms), pentadecanoic acid (another name: pentadecylic acid, 15 carbon atoms), hexadecanoic acid (another name: palmitic acid, 16 carbon atoms), heptadecanoic acid (another name: margaric acid, 17 carbon atoms), octadecanoic acid (another name: stearic acid, 18 carbon atoms), nonadecanoic acid (another name: nonadecylic acid, 19 carbon atoms), eicosanoic acid (another name: arachidic acid, 20 carbon atoms), behenic acid (another name: docosanoic acid, 22 carbon atoms), lignoceric acid (another name: tetracosanoic acid, 24 carbon atoms), and hexacosanoic acid (another name: cerotic acid, 26 carbon atoms); and unsaturated fatty acids such as palmitoleic acid (16 carbon atoms), oleic acid (18 carbon atoms), linoleic acid (18 carbon atoms), linolenic acid (18 carbon atoms), arachidonic acid (20 carbon atoms), erucic acid (22 carbon atoms), and nervonic acid (another name: cis-15-tetracosenoic acid, 24 carbon atoms). Oleic acid, linoleic acid, stearic acid, lauric acid, butanoic acid, and erucic acid are particularly preferable. With respect to the fatty acid serving as the second protective agent described above, a plurality of fatty acids may be combined and used. As long as the second protective agent includes at least one unsaturated or saturated fatty acid having 4 or more and 24 or less carbon atoms, other fatty acid may exist.

(i-3) Ethyl Cellulose

The process of the present invention is characterized by the application of a metal ink including not only the above first and second protective agents but also ethyl cellulose. The addition of ethyl cellulose to the metal ink is intended to make a less wettable metal ink with respect to the fluorine-containing resin layer mentioned above. The reason is not clear, but studies of the present inventors have revealed that the wettability of the metal ink changes by adding ethyl cellulose to the metal ink having the above configuration. The combination between this less wettable metal ink and the fluorine-containing resin layer having optimized liquid-repellency (surface free energy) enables to effectively repel the metal ink in the region other than the pattern formation section and to form a metal pattern.

Ethyl cellulose to be added to the metal ink of the present invention is preferably a low-molecular weight ethyl cellulose having a number average molecular weight of 4,000 to 30,000. The reason is not clear, but the effect of adjusting the wettability of the metal ink mentioned above is liable to be apparent with the use of a low-molecular weight ethyl cellulose. Ethyl cellulose to be added is preferably a low-molecular weight ethyl cellulose having a number average molecular weight of 10,000 to 25,000.

The metal ink to be applied in the present invention may additionally contain a high-molecular weight ethyl cellulose, in addition to the low-molecular weight ethyl cellulose. Printability may be improved in some cases, by applying a metal paste to which not only a low-molecular weight ethyl cellulose but also a high-molecular weight ethyl cellulose is added. The high-molecular weight ethyl cellulose refers to ethyl cellulose having a number average molecular weight of 40,000 to 90,000, and is preferably one having a number average molecular weight of 55,000 to 85,000.

When both low-molecular weight ethyl cellulose and high-molecular weight ethyl cellulose are added to the metal ink, the proportion of the content based on the mass of the low-molecular weight ethyl cellulose ($C_{LOW}$) to the content based on the mass of the high-molecular weight ethyl cellulose ($C_{HIGH}$), ($C_{HIGH}/C_{LOW}$) is preferably 0.05 to 1.0, and is particularly preferably 0.1 to 0.4.

(i-4) Composition of Metal Ink

The metal particles protected by the first and second protective agents and ethyl cellulose described above are dispersed in a solvent to constitute the metal ink. The solvent applicable here is an organic solvent, and examples of the solvent include alcohol, benzene, toluene, and alkanes. These solvents may be mixed. Examples of the preferred solvent include alkanes such as hexane, heptane, octane, nonane and decane; and alcohols such as methanol, ethanol, propanol, butanol, pentanol, hexanol, heptanol, octanol, nonanol and decanol; and a mixed solvent of one or two or more alcohols and one or two or more alkanes each selected from the above-mentioned solvents is more preferable.

The content of metal particles in the metal ink is preferably 20% by mass or more and 70% by mass or less in terms of mass of metal relative to the mass of liquid. When the content of metal particles is less than 20%, a metal pattern with a uniform thickness for securing sufficient electric conductivity cannot be formed on the pattern formation section, and thus the resistance value of the metal pattern increases. When the content of metal particles exceeds 70%, the formation of a stable metal pattern is difficult due to the aggregation and expansion of metal particles.

The content of the protective agent in the metal ink is preferably specified based on the metal mass in the metal ink. The content of the amine compound serving as the first protective agent is preferably 0.08 mmol/g or more and 3.0 mmol/g or less based on the metal mass. The content of the fatty acid serving as the second protective agent is preferably 0.005 mmol/g or more and 0.5 mmol/g or less based on the metal mass. It is more preferably 0.007 mmol/g or more and 0.5 mmol/g or less. The content of the protective agent in the metal ink exceeding the above preferred range does not influence the dispersibility of metal particles, but an excessive amount of the protective agent influences the low-temperature sintering characteristics of metal particles and the resistance value of a metal pattern to be formed, and thus the above range is preferable. When a plurality of amine compounds and fatty acids are used, the total mole number is applied as the mole number of each of the protective agents.

The content of ethyl cellulose is preferably 0.0035 µmol/g or more and 16.7 µmol/g or less based on the metal mass in the metal ink. When the content of ethyl cellulose is the lower limit value or less, improvement of the liquid-repellency of the ink is insufficient, and when it is the upper limit value or more, metal particles are not adsorbed to the functional group of an exposed fluorine-containing resin layer surface, so that the wiring pattern may not be formed in some cases. When both low-molecular weight ethyl cellulose and high-molecular weight ethyl cellulose are added, the range is determined as the total amount of the both.

(ii) Application Step of Metal Ink

The metal ink described above is applied to a substrate subjected to treatment such as exposure. For application method of the metal ink, dipping, spin coating, or roll coating can be applied, but the ink may be dropped and spread with an application member such as a blade, a squeegee, or a spatula. In the present invention, a functional group for selectively fixing metal particles is formed on the pattern formation section in advance, so that a pattern can be efficiently formed by spreading the dispersion liquid at a time.

(iii) Fixation Step of Metal Particles

On a base surface of a fluorine-containing resin on which no functional group exists, the metal ink is repelled due to the liquid-repellency of the resin. When an application member such as a blade is used, the repelled dispersion liquid is removed from the surface of the substrate. On a pattern formation section on which a functional group is formed, a substitution reaction of the protective agent for metal particles with the functional group occurs, and the metal particles are fixed on the substrate. Thereafter, the solvent in the dispersion liquid is volatilized, and the metal particles on the substrate are self-sintered to form a metal film, which leads to the formation of a metal pattern.

Since self-sintering is a phenomenon that occurs even at room temperature, heating of the substrate is not an essential step in the formation of a metal pattern. However, when the metal pattern after self-sintering is fired, the protective agent (amine compound and fatty acid) remaining in the metal film can be completely removed, so that the resistance value can be reduced. This firing treatment is preferably performed at a temperature of 40° C. or more and 250° C. or less. A temperature of lower than 40° C. is not preferable because it takes a long time for desorption and volatilization of the protective agent. A temperature of higher than 250° C. causes deformation of the resin substrate or the like. The firing time is preferably 3 minutes or more and 120 minutes or less. The firing step may be carried out in an air atmosphere or in a vacuum atmosphere.

A metal pattern including metal is formed by the application of a metal ink, self-sintering of metal particles, and firing as necessary.

Advantageous Effects of Invention

With the metal pattern method of the present invention, a highly fine metal pattern including silver or the like can be efficiently formed on various base materials. In the present invention, the scope of the range of applicable fluorine-containing resins is expanded by setting the liquid-repellency on the surface of the fluorine-containing resin layer on the base material and adjusting the wettability of the metal ink. Therefore, a higher-quality metal pattern can be formed even with a low-cost fluorine-containing resin which is poor in liquid-repellency.

In the pattern formation process of the present invention, a base material provided with a fluorine-containing resin layer is subjected to treatment such as light irradiation, and then a metal ink is applied, so that patterning is enabled. A metal pattern can be formed through relatively easy steps. The present invention provides a method that is more convenient than a photolithography method generally with a resist and more efficient than an ink-jet method.

In the present invention, a fine and highly vivid metal pattern can be formed. This metal pattern can exert light transmissivity comparable to that of a transparent electrode. Thus, a transparent electric conductor can also be produced by forming a metal pattern on a transparent base material.

BRIEF DESCRIPTION OF THE DRAWINGS

FIGS. 2(a) and 2(b) are enlarged photographs of a silver wiring in which the fluorine-containing resin No. 3 is applied in the formation of a metal pattern of Second Embodiment.

DETAILED DESCRIPTION OF THE PREFERRED EMBODIMENTS

Figure 1:
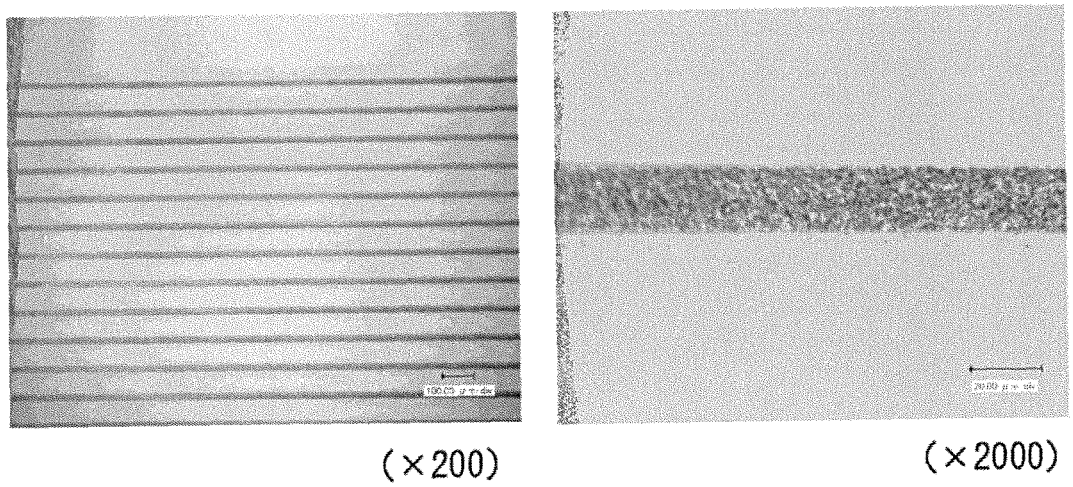
FIG. 1 is an enlarged photograph of a silver wiring in which the fluorine-containing resin No. 2 is applied in the formation of a metal pattern of Second Embodiment.
Figure 1:
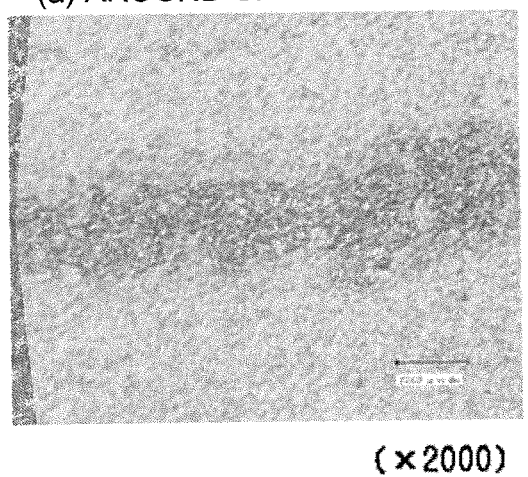
Figure 1:
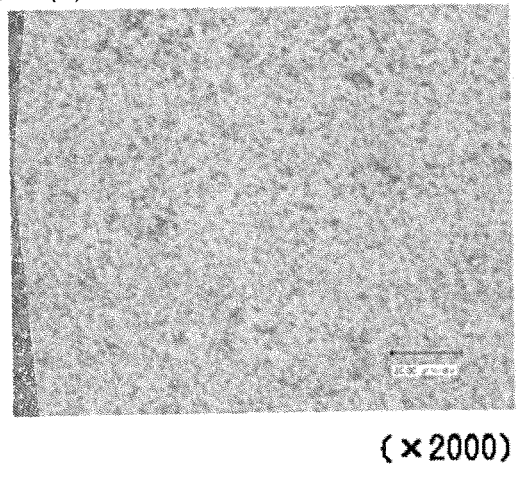

First Embodiment (preliminary test): Hereinafter, a preferred embodiment of the present invention will be described. The present embodiment is a preliminary test for determining a preferred fluorine-containing resin and metal ink in the formation of a metal pattern. In this preliminary test, a resin film was used as the base material, and a plurality of fluorine-containing resins was applied to the base material to form fluorine-containing resin layers. Then, the surface free energy of the plurality of fluorine-containing resin layers was measured by the Owens-Wendt method. Then, two inks, that is, an ethyl cellulose-containing ink applicable to the present invention and the metal ink used in the conventional process (Patent Document 1) were applied to the plurality of fluorine-containing resin layers formed and the availability of printing (presence or absence of ink repellency) was evaluated.

[Formation of Fluorine-Containing Resin Layer]

A resin base material (size: 400 mm×200 mm) including polyethylene terephthalate (PET) was prepared as the base material. The following commercially available fluorine-containing resins were applied to this base material to form fluorine-containing resin layers.

TABLE 1

| | Product name (model number) | Manufacturer |
|---|---|---|
| No. 1 | PC-3B + FG-5083F130-0.1 | FluoroTechnology Co., LTD. |
| No. 2 | FS-1010C-4.0 | FluoroTechnology Co., LTD. |
| No. 3 | Novec1720 | 3M Japan Limited |
| No. 4 | 3% SA-PFA/HFX110 | Chemours-Mitsui Fluoroproducts Co., Ltd. |
| No. 5 | SFE-DP02H | AGC SEIMI CHEMICAL CO., LTD. |
| No. 6 | CYTOP M + CYTOP A | AGC Inc. |

For No. 1, PC-3B was applied and then FG-5083F130-0.1 was applied on PC-3B.

For No. 6, CYTOP M and CYTOP A were mixed and then applied.

In the formation of fluorine-containing resin layers with the fluorine-containing resins No. 2 to No. 6, 2004 of each of fluorine-containing resin was applied to the base material by a roll coating method, and the base material was heated and dried at 110° C. for 7 minutes. For the fluorine-containing resin No. 1, 2004 of PC-3B was applied to the base material by a roll coating method, and the base material was dried at 60° C. for 7 minutes, and further, 2004 of FG-5083F130-0.1 was applied to the base material by a roll coating method, and the base material was heated and dried at 110° C. for 7 minutes.

Measurements of the surface free energy ($\gamma_S$) by the Owens-Wendt method were performed on the produced various fluorine-containing resin layers. As mentioned above, the contact angles of two kinds of liquids whose $\gamma_L$, $\gamma_L^d$, $\gamma_L^h$ in Expression 1 are known were measured by the Owens-Wendt method. In the present embodiment, water and n-octane were used as specimens, and the contact angle of each liquid to each fluorine-containing resin layer was measured. Measurement conditions were such that 4±0.5 μL of a specimen was dropped on the surface of a fluorine-containing resin layer in an atmosphere of a temperature of 20 to 21° C. and a humidity of 25 to 35% and the contact angle after a lapse of 10 seconds was measured. The contact angle was measured by a drop method with a contact angle meter (DMs-401 manufactured by Kyowa Interface Science Co., Ltd.). In the drop method, a droplet is landed on the surface of a fluorine-containing resin layer, the states before and after landing were taken from a side with an optical camera attached to the meter, and the angle between the droplet after a lapse of 10 seconds and the surface of the specimen was measured as the contact angle θ. In the present embodiment, each fluorine-containing resin was measured at 5 points and the average value thereof was employed. Then, the contact angle between water and n-octane in each fluorine-containing resin was substituted in the above expression of Expression 3 and $\gamma_S^d$ and $\gamma_S^h$ were calculated, whereby the surface free energy ($\gamma_S$) was determined. Into the values $\gamma_L$, $\gamma_L^d$, and $\gamma_L^h$ at liquid side which are required for calculation, $\gamma_{L(w)}$=72.8 mN/m, $\gamma_{L(w)}^d$=21.8 mN/m, and $\gamma_{L(w)}^h$=51.0 mN/m were substituted as the values of water, and $\gamma_{L(o)}$=21.6 mN/m, $\gamma_{L(o)}^d$=21.6 mN/m, and $\gamma_{L(o)}^h$=21.6 mN/m were substituted as the values of n-octane. The surface free energy ($\gamma_S$) of the fluorine-containing resins No. 1 to No. 6 was as follows.

TABLE 2

| | Product name (model number) | $\gamma_s^d$ (mN/m) | $\gamma_s^h$ (mN/m) | $\gamma_s$ (mN/m) |
|---|---|---|---|---|
| No. 1 | PC-3B + FG-5083F130-0.1 | 20.56 | 2.57 | 23.13 |
| No. 2 | FS-1010C-4.0 | 13.92 | 0.02 | 13.94 |
| No. 3 | Novec1720 | 18.70 | 1.79 | 20.49 |
| No. 4 | 3% SA-PFA/HFX110 | 15.54 | 2.31 | 17.85 |
| No. 5 | SFE-DP02H | 13.58 | 1.20 | 14.78 |
| No. 6 | CYTOP M + CYTOP A | 18.80 | 0.65 | 19.45 |

[Production of Metal Ink]

In the present embodiment, silver inks in which silver particles are dispersed were used as metal inks. The silver ink was produced by producing silver particles that use a thermally decomposable silver compound as the raw material by a thermal decomposition method and dispersing these silver particles in a solvent. In the present embodiment, two inks, that is, an ethyl cellulose-containing silver ink of the present invention (hereinafter referred to as KK ink) and the metal ink used in Patent Document 1 (hereinafter referred to as TG ink) were produced.

[Production of KK Ink]

For the silver compound serving as the raw material, silver carbonate was used. First, 25.56 g of silver carbonate (silver content: 20.56 g) and 9.32 g of water (33 wt % with respect to 100 parts by weight of silver carbonate) were mixed and stirred. Next, 3-methoxypropylamine as an amine compound serving as a protective agent was added to the silver compound at a 6-fold molar ratio with respect to the silver mass in the silver compound, whereby a silver-amine complex was produced.

Then, the produced silver-amine complex was heated from room temperature and decomposed to precipitate silver particles. Regarding the heating temperature at this time, the decomposition temperature of the complex was assumed to be 110 to 130° C., and this decomposition temperature was determined as the arrival temperature. The heating rate was set to 10° C./min. Thereafter, methanol was added to wash the silver particles, which were then centrifuged. The washing and centrifugation were repeated twice. The particle size of the silver particles was found to be 120 nm in mean particle size, from the results of SEM observations.

The obtained silver particles were mixed with a mixed solvent of octane and 1-propanol (octane:1-propanol=7:3), and 3,500 ppm of hexylamine (0.115 mmol/g based on the metal mass) and 650 ppm of dodecylamine (0.0117 mmol/g based on the metal mass) which are amine compounds serving as protective agents, and further, 800 ppm of erucic acid (0.00787 mmol/g based on the metal mass) which is a fatty acid were added to the mixture. This solution was treated with a vibrator (CUTE MIXER CM 1000 manufactured by TOKYO RIKAKIKAI CO, LTD) at 1,800 Hz for 30 minutes, and then centrifuged, and the supernatant was removed. Thereafter, ethyl cellulose was added to obtain a metal ink. The addition of ethyl cellulose was performed by mixing a solution in which ethyl cellulose (NISSHIN-KASEI CO., LTD., trade name: ETHOCEL 7 (number average molecular weight: about 17,000) was dissolved with a mixed solvent of octane and 1-propanol. At this time, the amount of mixed solvent and ethyl cellulose was adjusted such that the content of ethyl cellulose is 1% by mass with respect to the metal ink and the content of silver is 35% by mass with respect to the metal ink. Finally, this solution was treated with a vibrator at 1,800 Hz for 10 minutes to obtain a milky silver ink (KK ink).

[Production of TG Ink]

In the production of the TG ink (Patent Document 1), silver oxalate was used as the silver compound serving as the raw material. To 1.519 g of silver oxalate serving as the raw material (silver: 1.079 g), 0.651 g of decane was added to wet silver oxalate. Then, an amine compound and a fatty acid serving as protective agents were added to this silver oxalate. Specifically, first, N,N-dimethyl-1,3-diaminopropane (0.778 g) was added and kneaded for some time, and then, hexylamine (1.156 g), dodecylamine (0.176 g), and oleic acid (0.042 g) were further added thereto and kneaded, and thereafter, the mixture was heated and stirred at 110° C. This heating and stirring operation was performed until no bubble was generated from the reaction system. After the end of the reaction, the reaction system was allowed to cool to room temperature, and methanol was added thereto and thoroughly stirred, which was subjected to centrifugation. An excessive amount of protective agent was thereby removed to purify silver particles. The addition of methanol and the purification of silver fine particles by centrifugation were repeated to obtain silver particles as precipitates. The particle size of these silver particles was 15 nm in mean particle size.

To the produced silver particles, a mixed solvent of octane and butanol (octane:butanol=4:1 (volume ratio)) was added to obtain a silver ink. The silver concentration of this silver ink was 40% by mass.

[Evaluation of Liquid-Repellency of Each Fluorine-Containing Resin]

Two kinds of silver inks produced as described above (KK ink and TG ink) were applied to the fluorine-containing resin layers No. 1 to No. 6, whereby the liquid-repellency was evaluated and the availability of printing by each silver ink was examined. In this evaluation method, the silver ink was applied to the base material (fluorine-containing resin layer) by a roll coating method and the total light transmittance (T.T) of the base material after application was measured. When the fluorine-containing resin layer exerts liquid-repellency to the silver ink, the silver ink is repelled, so that no silver ink remains on the surface of the fluorine-containing resin layer after passing of rolls and the base material is not colored. Thus, the difference between the transmittances before and after application (ΔT.T) becomes lower. In contrast, when the liquid-repellency of the fluorine-containing resin layer to the silver ink is poor, silver ink remains on the surface and the base material is colored.

Specific evaluation conditions of this test were determined in accordance with JIS K7316-1 (Plastics-Determination of the total luminous transmittance of transparent materials). The amount of silver ink applied was 40 μL, and each sample was measured at three points (measurement point area ϕ50 mm). The total light transmittance (T.T) of the base material was measured with SH7000 manufactured by NIPPON DENSHOKU INDUSTRIES Co., Ltd. With respect to the measured difference between the transmittances before and after application (ΔT.T), one having a value of −4.5≤ΔT.T≤0 was judged as "no coloration" and considered good (○), one having a value of −10.0≤ΔT.T<−4.5 was determined as "slightly colored" (Δ). When the value was ΔT.T<−10.0, the layer was judged as "entirely colored" and determined as failed (x). Table 3 shows the evaluation results of the liquid-repellency (printability) of the above.

TABLE 3

| Product name (model number) | $\gamma_s$ (mN/m) | Silver ink | Liquid-repellency evaluation result Δ T.T | Judgement |
|---|---|---|---|---|
| No. 1 PC-3B + FG-5083F130-0.1 | 23.13 | KK INK | −5.55 | Δ |
| | | TG INK | −65.99 | x |
| No. 2 FS-1010C-4.0 | 13.94 | KK INK | −3.70 | ○ |
| | | TG INK | −45.22 | x |
| No. 3 Novec1720 | 20.49 | KK INK | 23.01 | x |
| | | TG INK | −65.15 | x |
| No. 4 3% SA-PFA/HFX110 | 17.85 | KK INK | −2.75 | ○ |
| | | TG INK | −67.05 | x |
| No. 5 SFE-DP02H | 14.78 | KK INK | −2.73 | ○ |
| | | TG INK | −73.57 | x |
| No. 6 CYTOP M + CYTOP A | 19.45 | KK INK | 2.36 | ○ |
| | | TG INK | 2.40 | ○ |

Table 3 shows that the fluorine-containing resins evaluated this time were, except for CYTOP (registered trademark) of No. 6, poor in liquid-repellency to the conventional silver ink (TG INK), and the ink remained on the surface of the base material and colored the base material. Consequently, it was confirmed that the conventional process has a problem as described above.

The fluorine-containing resin layers No. 1 to No. 5 will be examined. These fluorine-containing resin layers were found to exert preferred liquid-repellency in association with the fluorine-containing resin layers No. 2, 4, and 5, when the silver ink including ethyl cellulose (KK ink) to be applied in the present invention was applied. The fluorine-containing resin layers No. 2, 4, and 5 have a surface free energy ($\gamma_S$) of 20 or less. It is found from the results that the preferred liquid-repellency is generated by the cooperation between the fluorine-containing resin having moderate liquid-repellency (surface free energy) and the silver ink which became less wettable due to ethyl cellulose, so that the printability is improved.

On the other hand, the fluorine-containing resin layers No. 1 and 3 have a surface free energy ($\gamma_S$) of more than 20 mN/m, and it is deemed that they are resins having low liquid-repellency among the fluorine-containing resins examined this time. It is deemed that these fluorine-containing resin layers are poor in liquid-repellency and printability even by applying the silver ink containing ethyl cellulose (KK ink) as well as the silver ink containing no ethyl cellulose (TG ink).

The fluorine-containing resin layer (CYTOP (registered trademark)) No. 6 exhibits liquid-repellency to both silver inks. This fluorine-containing resin is also deemed to be applicable to the present invention. As can be seen from the values of the surface free energy ($\gamma_S$) of the fluorine-containing resins examined this time, the fluorine-containing resin layers No. 2, 4, and 5 have lower free energy ($\gamma_S$) values than CYTOP (registered trademark) of No. 6.

Accordingly, it is deemed that the fluorine-containing resin layers No. 2, 4, and 5 have higher liquid-repellency based on water and n-octane than CYTOP (registered trademark). However, the liquid-repellency of the fluorine-containing resin layers No. 2, 4, and 5 is insufficient for the conventional silver ink (TG ink). When the silver ink containing ethyl cellulose (KK ink) of the present invention is applied, the liquid-repellency of the fluorine-containing resin layers No. 2, 4, and 5 improves. However, even the silver ink (KK ink) of the present invention cannot be applied to the fluorine-containing resins (No. 1 and 3) having free energy ($\gamma_S$) values of more than 20 mN/m. Thus, it is deemed that, in the metal pattern formation process of the present invention, the effect was produced through optimization of the basic liquid-repellency of the fluorine-containing resin and the characteristics of the metal ink.

Second Embodiment: In the present embodiment, four kinds of fluorine-containing resins No. 2 to No. 5 of First Embodiment were used to perform study tests of the formation or non-formation of a metal pattern.

[Formation of Metal Pattern]

The same PET substrate as in First Embodiment was prepared, and after 200 μL of each fluorine-containing resin was applied to the base material by a roll coating method, the base material was heated and dried at 110° C. for 7 minutes to form a fluorine-containing resin layer, similarly to First Embodiment.

Next, a photomask having a linear wiring pattern (line width: 20 μm) was brought into contact with the surface of the substrate on which a fluorine-containing resin layer was formed (contact exposure with a mask-substrate distance of 0), and this was irradiated with an ultraviolet ray (VUV light). The VUV light was applied at 11 mW/cm$^{-2}$ with a wavelength of 172 nm for 5 seconds.

As described above, the metal ink was applied to the substrate on which a functional group was formed by subjecting the surface of the fluorine-containing resin layer to exposure treatment. As the metal ink, the KK ink containing ethyl cellulose which was produced in First Embodiment was applied. Application of the metal ink was performed by applying 40 μL of the ink to the substrate by a roll coater method. Thereafter, the substrate was hot air-dried at 120° C. to form a silver wiring (L/S=20 μm/20 μm).

[Evaluation of Metal Pattern]

The silver wiring formed as described above was observed with an optical microscope to check the presence or absence of blur of the wiring. The silver wiring having no blur was judged as passed "○" and the silver wiring having blur or an obviously non-uniform line width was judged as failed "x". In addition, the line width of the passed silver wiring was measured. The average value of the values obtained by measuring the line width at arbitrary three points with an optical microscope was determined as the line width of the silver wiring. Table 4 shows the evaluation results.

TABLE 4

| Product name (model number) | $\gamma_s$ (mN/m) | Silver ink | Pattern formation result Pass/fail | Average line width (μm) |
|---|---|---|---|---|
| No. 2 FS-1010C-4.0 | 13.94 | KK INK | ○ | 19.45 |
| No. 3 Novec1720 | 20.49 | | x | — |
| No. 4 3VoSA-PFA/HFX110 | 17.85 | | ○ | 19.11 |

TABLE 4-continued

| Product name (model number) | $\gamma_s$ (mN/m) | Silver ink Pass/fail | Pattern formation result Average line width (μm) |
|---|---|---|---|
| No. 5 SFE-DPO2H | 14.78 | ○ | 19.36 |

It was confirmed from Table 3 that silver wiring with a good pattern can be formed by applying fluorine-containing resins No. 2, No. 4, and No. 5 which had good liquid-repellency in First Embodiment. FIG. 1 is an optical micrograph (×200 and 2,000) of the silver wiring to which the fluorine-containing resin No. 2 was applied. It can be confirmed that a clear silver wiring was formed. It can also be confirmed that a silver wiring having a line width approximate to a target line width can be formed by applying these fluorine-containing resins.

On the other hand, when the fluorine-containing resin No. 3 which had insufficient liquid-repellency in First Embodiment was applied, an entirely thin silver wiring was formed and measurement of the line width was impossible. FIG. 2(a) is an optical micrograph (×2,000) of a portion where a silver wiring was formed, but the outer edge of the wiring is unobvious and it is far from a wiring. In addition, since this fluorine-containing resin No. 3 has poor liquid-repellency, silver particles were adsorbed to non-exposed regions (region where no functional group is formed) (FIG. 2(b)). In such a state where silver particles adsorbed to portions other than wiring pattern, it cannot be deemed that a good pattern was formed. In addition, such a state may cause a short circuit and the function as wiring cannot be exerted.

INDUSTRIAL APPLICABILITY

As described above, a fine metal pattern can be efficiently formed by the present invention. With such an effect, the range of choice of the fluorine-containing resin that is the essential configuration in the present invention is widened. The present invention can be effectively applied to not only the formation of electrodes and wiring for various kinds of semiconductor devices, but also the formation of wiring on a panel surface of a touch panel that is required to have light transmissivity. Since the present invention can be implemented at low cost, it can be applied to a base material having a large area and can also be applied to building materials and the like.

What is claimed is:

1. A method for forming a metal pattern on a pattern formation section set in a part or the whole of a region on a base material,
   the base material comprising a fluorine-containing resin layer on a surface including at least the pattern formation section,
   the method comprising: a step of forming a functional group on the pattern formation section on the surface of the fluorine-containing resin layer; and a step of applying a metal ink in which metal particles protected by an amine compound serving as a first protective agent and a fatty acid serving as a second protective agent are dispersed in a solvent to the surface of the base material to fix the metal particles on the pattern formation section,
   wherein the fluorine-containing resin layer comprises a fluorine-containing resin having a surface free energy measured by the Owens-Wendt method of 13 mN/m or more and 20 mN/m or less, and
   the metal ink comprises ethyl cellulose as an additive, wherein the only ethyl cellulose in the metal ink is a low-molecular weight ethyl cellulose having a number average molecular weight of 4,000 to 30,000.

2. The method for forming a metal pattern according to claim 1, wherein in the step of forming a functional group on the surface of the fluorine-containing resin layer, an energy of 1 mJ/cm$^2$ or more and 4,000 mJ/cm$^2$ or less is applied to the pattern formation section of the surface of the fluorine-containing resin layer.

3. The method for forming a metal pattern according to claim 2, wherein at least one of a carboxy group, a hydroxy group, and a carbonyl group is formed as the functional group.

4. The method for forming a metal pattern according to claim 2, wherein the amine compound serving as the first protective agent comprises at least one amine compound having 4 or more and 12 or less carbon atoms.

5. The method for forming a metal pattern according to claim 2, wherein the fatty acid serving as the second protective agent comprises at least one fatty acid having 4 or more and 26 or less carbon atoms.

6. The method for forming a metal pattern according to claim 1, wherein at least one of a carboxy group, a hydroxy group, and a carbonyl group is formed as the functional group.

7. The method for forming a metal pattern according to claim 6, wherein the amine compound serving as the first protective agent comprises at least one amine compound having 4 or more and 12 or less carbon atoms.

8. The method for forming a metal pattern according to claim 6, wherein the fatty acid serving as the second protective agent comprises at least one fatty acid having 4 or more and 26 or less carbon atoms.

9. The method for forming a metal pattern according to claim 1, wherein the amine compound serving as the first protective agent comprises at least one amine compound having 4 or more and 12 or less carbon atoms.

10. The method for forming a metal pattern according to claim 9, wherein the amine compound is at least one of butylamine, 1,4-diaminobutane, 3-methoxypropylamine, pentylamine, 2,2-dimethylpropylamine, 3-ethoxypropylamine, N,N-dimethyl-1,3-diaminopropane, hexylamine, heptylamine, benzylamine, N,N-diethyl-1,3-diaminopropane, octylamine, 2-ethylhexylamine, nonylamine, decylamine, diaminodecane, undecylamine, dodecylamine, and diaminododecane.

11. The method for forming a metal pattern according to claim 1, wherein the fatty acid serving as the second protective agent comprises at least one fatty acid having 4 or more and 26 or less carbon atoms.

12. The method for forming a metal pattern according to claim 11, wherein the fatty acid is at least one of oleic acid, stearic acid, linoleic acid, lauric acid, butanoic acid, and erucic acid.

13. The method for forming a metal pattern according to claim 1, wherein the solvent of the metal ink is an alcohol solvent having 3 or more and 8 or less carbon atoms, a hydrocarbon solvent having 6 or more and 10 or less carbon atoms, or a mixed solvent of these solvents.

14. The method for forming a metal pattern according to claim 1, comprising a step of heating the base material at a temperature of 40° C. or more and 250° C. or less after fixing the metal particles on the pattern formation section.

15. The method for forming a metal pattern according to claim 1, wherein the metal particles comprise at least one of silver, gold, platinum, palladium, copper, and an alloy of these metals.

16. A method for forming a metal pattern on a pattern formation section set in a part or the whole of a region on a base material, the base material comprising a fluorine-containing resin layer on a surface including at least the pattern formation section, the method comprising: a step of forming a functional group on the pattern formation section on the surface of the fluorine-containing resin layer; and a step of applying a metal ink in which metal particles protected by an amine compound serving as a first protective agent and a fatty acid serving as a second protective agent are dispersed in a solvent to the surface of the base material to fix the metal particles on the pattern formation section, wherein the fluorine-containing resin layer comprises a fluorine-containing resin having a surface free energy measured by the Owens-Wendt method of 13 mN/m or more and 20 mN/m or less, and the metal ink comprises ethyl cellulose as an additive, wherein the ethyl cellulose in the metal ink comprises a low-molecular weight ethyl cellulose having a number average molecular weight of 4,000 to 30,000 and a high-molecular weight ethyl cellulose having a number average molecular weight of 40,000 to 90,000, and wherein a proportion of a content based on the mass of the low-molecular weight ethyl cellulose ($C_{Low}$) to a content based on the mass of the high-molecular weight ethyl cellulose ($C_{HIGH}$), ($C_{HIGH}/C_{Low}$) is 0.05 to 0.4.

* * * * *